(12) United States Patent
McDermott et al.

(10) Patent No.: US 6,744,526 B2
(45) Date of Patent: Jun. 1, 2004

(54) IMAGE SENSOR HAVING BLACK PIXELS DISPOSED IN A SPACED-APART RELATIONSHIP FROM THE ACTIVE PIXELS

(75) Inventors: Bruce C. McDermott, Penfield, NY (US); Gregory O. Moberg, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 258 days.

(21) Appl. No.: 09/953,846

(22) Filed: Sep. 17, 2001

(65) Prior Publication Data

US 2002/0140997 A1 Oct. 3, 2002

Related U.S. Application Data

(60) Provisional application No. 60/267,849, filed on Feb. 9, 2001.

(51) Int. Cl.[7] .............................. G06K 15/00; H04N 9/62
(52) U.S. Cl. ...................... 358/1.11; 348/245; 348/243
(58) Field of Search .............................. 358/1.11, 1.15, 358/1.4, 3.31, 482, 483; 348/245, 251, 294, 298

(56) References Cited

U.S. PATENT DOCUMENTS

| | | | | |
|---|---|---|---|---|
| 5,521,639 A | * | 5/1996 | Tomura | 348/243 |
| 6,445,413 B1 | * | 9/2002 | Hosier | 348/245 |
| 2002/0140997 A1 | * | 10/2002 | McDermott | 358/504 |

FOREIGN PATENT DOCUMENTS

| | | | | |
|---|---|---|---|---|
| EP | 0 541 332 A1 | | 5/1993 | .......... H04N/5/217 |
| EP | 0541332 | * | 5/1993 | .......... H04N/5/217 |
| EP | 1237353 | * | 9/2002 | .......... H04N/1/401 |
| JP | 2002-314758 | * | 10/2002 | .......... H04N/1/028 |

* cited by examiner

Primary Examiner—Jerome Grant, II
(74) Attorney, Agent, or Firm—Peyton C. Watkins

(57) ABSTRACT

An image sensor includes an active pixel area for image capture; one or more black pixel areas disposed in a predetermined, significant spaced apart distance from the active pixel area; and a light shield to prevent light from illuminating the black pixel areas.

11 Claims, 3 Drawing Sheets

IMAGE SENSOR HAVING BLACK PIXELS DISPOSED IN A SPACED-APART RELATIONSHIP FROM THE ACTIVE PIXELS

This application claims the benefit of Provisional Application No. 60/267,849, filed Feb. 9, 2001.

FIELD OF THE INVENTION

The present invention relates to image sensors and, more particularly, to such image sensors having black reference pixels located in a non-intrusive and more efficient position.

BACKGROUND OF THE INVENTION

Currently used imaging sensors have black reference pixels located in the area immediately surrounding the active pixels. As is well known in the art, such black reference pixels are used for calibration of the imaging processing chain. These black reference pixels may become contaminated by lateral diffusion in which red light generated electrons from the active pixel area contaminate the first few rows and columns of the black reference pixels. This results in inaccurate reproduction of the desired image.

Currently used CCD imaging sensors compensate for lateral diffusion by adding additional rows and columns of pixels in which these buffer pixel rows and columns absorb the lateral diffused energy. This solution requires the use of a secondary light shield that prevents illumination of the buffer pixel rows and columns. An alternate solution is to increase the number of black pixels beyond the amount normally needed. The extra black pixels are used to absorb the energy from lateral diffusion. In this case, a secondary light shield is not necessary.

In CMOS image sensors, several layers of an inter-leaved material (usually metal) are used to shield light from the black reference pixels. These inter-leaved layers, however, allow light to leak therethrough and illuminate the black pixels, resulting in black pixels that are light sensitive. Obviously, this is an undesirable phenomenon.

Although the currently known and utilized methods and apparatus for lateral diffusion compensation are satisfactory, they include drawbacks. Adding buffer pixel rows and columns uses significant areas of the silicon. Similarly, additional rows and columns of black reference pixels also uses significant areas of the silicon, which is not cost-efficient.

In CMOS imagers the inter-leaved layers of material, used for black shielding, are not totally opaque to light. The solution to this problem is to add a secondary light shield, which in turn increases the cost.

SUMMARY OF THE INVENTION

The present invention is directed to overcoming one or more of the problems set forth above. Briefly summarized, according to one aspect of the present invention, the invention resides in an image sensor comprising: (a) an active pixel area for image capture; (b) one or more black pixel areas disposed in a pre-determined, significant spaced apart distance from the active pixel area; and (c) a light shield to prevent light from illuminating the black pixel areas.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of improved performance black reference pixels in electronic imagers. This is accomplished through the use of a coverglass secondary light shield and geographically moving the black pixels a significant distance from the imaging pixels. This invention can be applied to all solid state imagers.

DETAILED DESCRIPTION OF THE INVENTION

Figure 1:
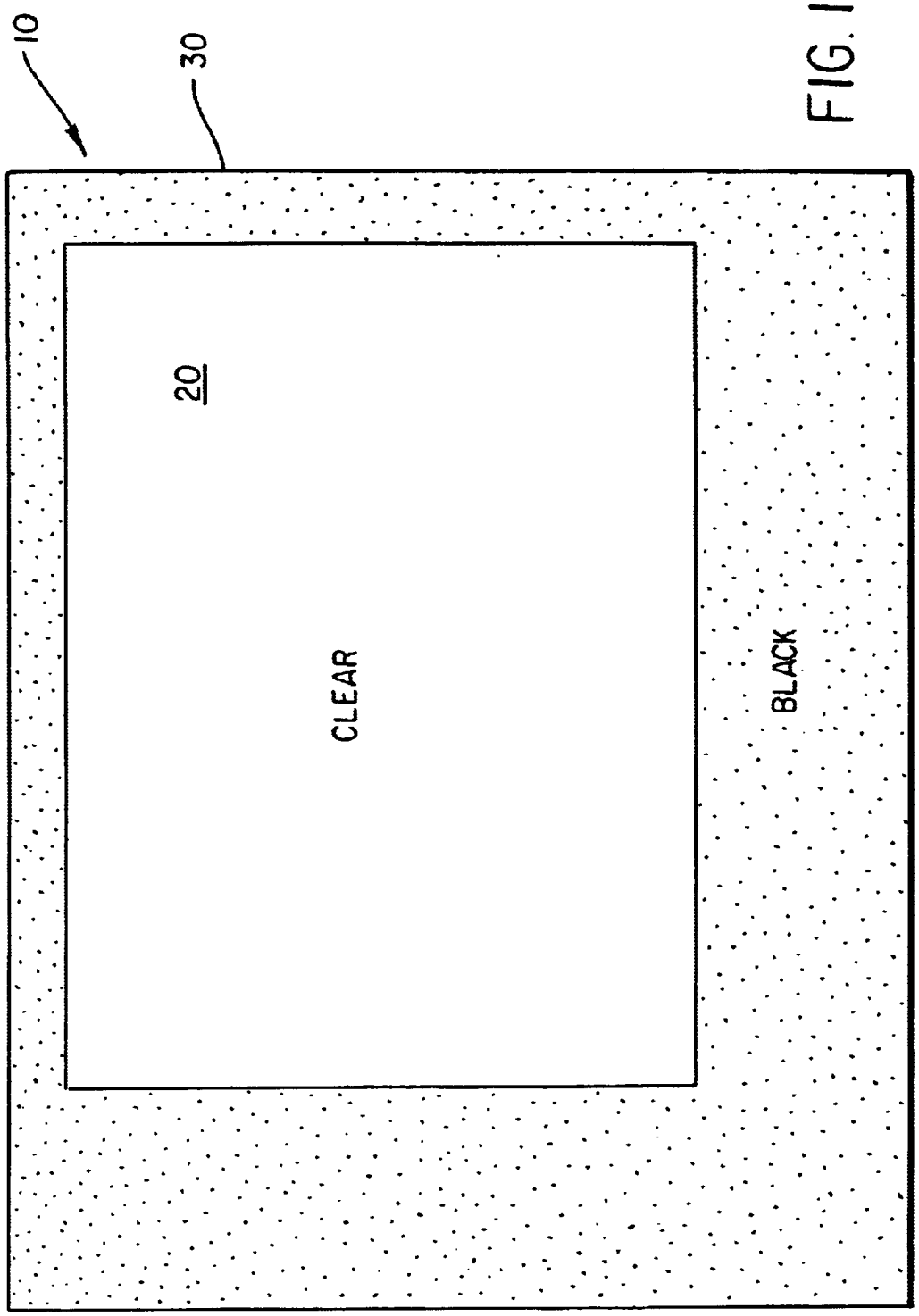
FIG. 1 is a drawing of a coverglass of the present invention.

Referring to FIG. 1, there is shown a coverglass 10 of the present invention. The coverglass 10 includes a clear central portion 20 in which light is transmitted therethrough and a light-shielded outer portion 30 in which light is not transmitted therethrough. The secondary light-shield outer portion 30 is formed by opaque material such as epoxy, paints, glues; metal; or oxides. This opaque material serves two purposes. The first purpose is to attach the coverglass 10 to the imager package and the second purpose is to shield the black pixels from the incoming light. It is instructive to note that the coverglass 10 and glue are one assembly. It is possible to accomplish the same result by using a separate secondary light shield and coverglass as is well known in the art. The secondary light shield 30 may also be formed from an opaque material which is coated directly onto a surface of the image sensor.

Figure 2:
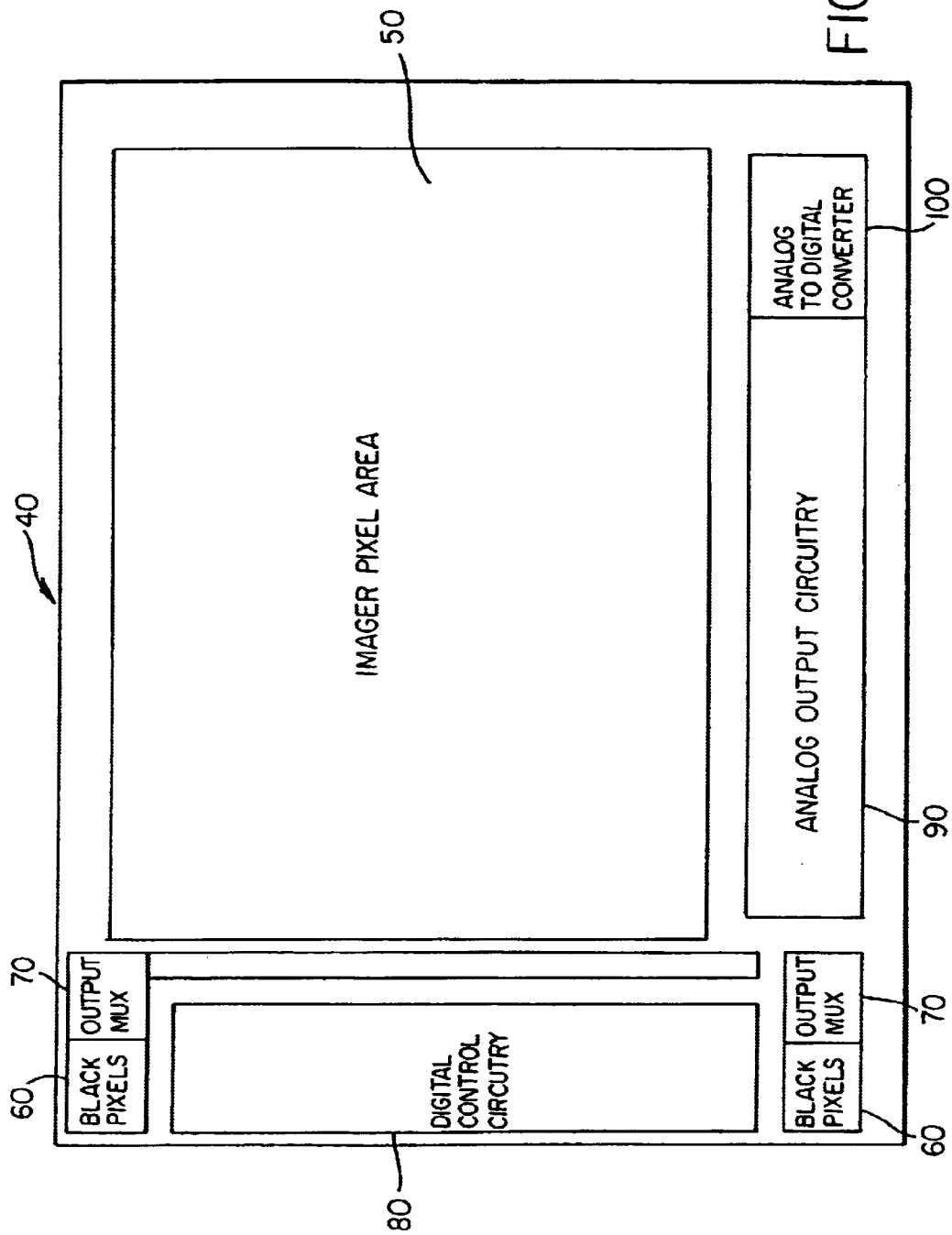
FIG. 2 is a floor plan representation of a CMOS imager embodiment of the present invention.

Referring to FIG. 2, there is shown a CMOS image sensor 40 of the present invention. The image sensor 40 includes an array of active picture pixels 50 arranged in a rectangular shape. As is well-known in the art, the active pixels 50 receive incident light which is converted into electrons and eventually a voltage for permitting capture of a digital representation of an image.

There is also shown a plurality of black reference pixels 60 and corresponding output multiplexing circuitry sections 70 both located at a predetermined significant distance from the active pixel area. The magnitude of the significant distance is established by the cone angle of the light of the focused image. The black pixels 60 are placed "far enough" under the secondary light shield such that image light can not illuminate the black pixels. Black reference pixels 60 are created by using active picture pixels with typically one or more metal layers deposited over them. The one or more metal layers are considered the primary light shield for the black pixels 60. Positioning the black reference pixels 60 at a significant distance from the active pixel area permits the opaque glue 30, on the coverglass 10, shown in FIG. 1, to shield light from the black pixels.

The magnitude of the significant distance is determined by the optical design such that the black pixel signals aren't affected by either lateral diffusion or light sensitivity due to inter-leaved light shielding layers. This is accomplished by physically separating the black pixels 60 from the active image sensitive pixels 50 so no light illuminates the black pixels 60. Additional distance can be added such that the overall design is insensitive to inaccuracy of coverglass 10 positioning.

To make this solution a low cost, production friendly, solution it can be loosely constrained. That is, it is desired not to have precise mechanical position requirements. The distance from the black pixel area(s) 60 to the active image area 50 is made great enough to satisfy these requirements, as those skilled in the art will be able to determine. The coverglass 10 can be positioned with "loose" tolerances due to the significant distance being chosen greater than the minimum required by the optical design.

In contrast, currently known and utilized imagers locate their black pixel area(s) adjacent to their active picture pixels.

It is instructed to know that one or more of the black reference pixel sections 60 and corresponding output multiplexing circuitry sections may be used depending on the design. Multiple black reference pixel sections 60 provide additional black pixel information. For example, due to processing variation and temperature differences across the imager die, the dark reference signal can vary across the area of the imager. This is compensated for by the having multiple black reference pixel areas 60 located at various locations on the imager die. In summary, these multiple black reference pixel areas 60 allow more accurate measurement of the black signal for the total image. It is also instructive to note that additional black reference pixel areas 60 may be used, as the illustrated locations are for example only.

The digital control circuitry 80, analog output circuitry 90 and analog to digital converter 100 are shown for reference purposes as is typical for the current state of the art. Such components are well known and will not be discussed in detail herein.

Figure 3:
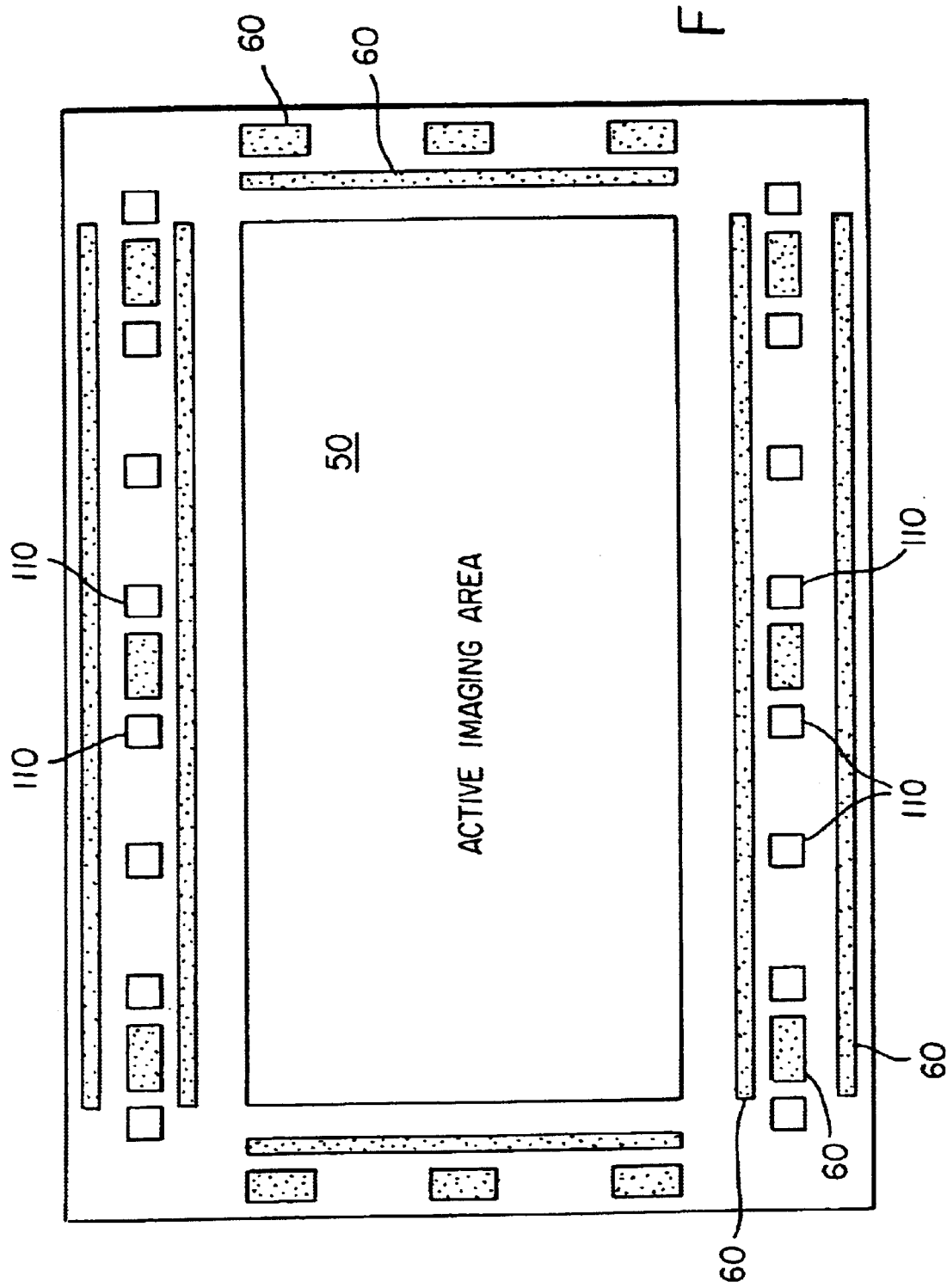
FIG. 3 is an alternative embodiment of FIG. 2.

Referring to FIG. 3, there is shown an alternative embodiment of the present invention for either CCD or CMOS imagers. In this embodiment, the black reference pixel sections 60 are located at a plurality of positions. One location for the black reference pixel section 60 is between wire bond pads 110, and another location is on either side of the bond pads 110. These locations are in general located on any or all sides of the image area 50, separated a significant distance from the image area 50.

The invention has been described in detail with particular reference to certain preferred embodiments thereof, but it will be understood that variations and modifications can be effected within the spirit and scope of the invention.

PARTS LIST

| | |
|---|---|
| 10 | coverglass |
| 20 | central portion |
| 30 | outer portion |
| 40 | sensor |
| 50 | pixels |
| 60 | black reference pixels |
| 70 | circuitry sections |
| 80 | digital control circuitry |
| 90 | output circuitry |

-continued

PARTS LIST

| | |
|---|---|
| 100 | A/D converter |
| 110 | bond pads |

What is claimed is:

1. An image sensor comprising:
   (a) an active pixel area for image capture;
   (b) one or more black pixel areas disposed in a predetermined, significant spaced apart distance from the active pixel area; and
   (c) a secondary light shield to prevent light from illuminating the black pixel areas; wherein the secondary light shield is a coverglass having a clear portion covering at least a portion of the active pixel area for permitting illumination of the active pixel area, and an opaque portion formed from an opaque material for preventing light from illuminating the one or more black pixel areas.

2. The image sensor as in claim 1, wherein the black pixel areas are a plurality that are located in different areas of the imager.

3. The image sensor as in claim 1, wherein the coverglass includes an opaque material which is selected from one or more of the following: epoxy, paints, glues; metal; or oxides.

4. The image sensor as in claim 1, wherein the secondary light shield includes an opaque material which is coated directly onto a surface of the image sensor.

5. The image sensor as in claim 1, wherein the one or more black pixel areas are disposed adjacent to bond pads.

6. The image sensor as in claim 1, wherein the one or more black pixel areas are disposed along a peripheral portion of the image sensor.

7. The image sensor as in claim 1 further comprising one or more multiplexers respectively in operation with the one or more black pixel areas.

8. An image sensor comprising:
   (a) an active pixel area for image capture;
   (b) one or more black pixel areas disposed in a predetermined, significant spaced apart distance from the active pixel area; and
   (c) a secondary light shield to prevent light from illuminating the black pixel areas; wherein the secondary light shield includes an opaque material which is coated directly onto a surface of the image sensor.

9. The image sensor as in claim 8, wherein the one or more black pixel areas are disposed adjacent to bond pads.

10. The image sensor as in claim 8, wherein the one or more black pixel areas are disposed along a peripheral portion of the image sensor.

11. The image sensor as in claim 8, further comprising one or more multiplexers respectively in operation with the one or more black pixel areas.

* * * * *